US006970030B1

United States Patent
Huang et al.

(10) Patent No.: US 6,970,030 B1
(45) Date of Patent: Nov. 29, 2005

(54) DUAL PHASED-LOCKED LOOP STRUCTURE HAVING CONFIGURABLE INTERMEDIATE FREQUENCY AND REDUCED SUSCEPTIBILITY TO INTERFERENCE

(75) Inventors: Yunteng Huang, Irvine, CA (US); Ligang Zhang, Austin, TX (US); Axel Thomsen, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 10/676,626

(22) Filed: Oct. 1, 2003

(51) Int. Cl.[7] ............................................. G06F 1/04
(52) U.S. Cl. ........................................ 327/296; 327/156
(58) Field of Search .................. 327/144, 146–148, 327/155–157, 162, 165, 291–299; 375/373–376; 331/177 R, DIG. 2

(56) References Cited

U.S. PATENT DOCUMENTS

| 6,067,335 A | * | 5/2000 | Yamanoi et al. ............ 375/374 |
| 6,114,987 A | * | 9/2000 | Bjornholt .................... 342/200 |
| 6,163,684 A | * | 12/2000 | Birleson ................... 455/182.3 |
| 6,188,258 B1 | * | 2/2001 | Nakatani ..................... 327/157 |
| 6,218,876 B1 | * | 4/2001 | Sung et al. .................. 327/156 |
| 6,703,876 B2 | * | 3/2004 | Fujiwara et al. ............ 327/156 |

* cited by examiner

Primary Examiner—Minh Nguyen
(74) Attorney, Agent, or Firm—Zagorin O'Brien Graham LLP

(57) ABSTRACT

A PLL function may be implemented as a dual-loop structure having a first PLL circuit which generates an intermediate signal from the reference signal, and a second PLL circuit which generates an output signal from the intermediate signal. The intermediate signal frequency is preferably chosen at a value in which potential interference signals do not have much energy. The first loop preferably has low bandwidth to provide good input jitter attenuation, while second loop preferably has higher bandwidth to reduce phase noise of the output signal. The circuit preferably provides for a choice of several different intermediate frequencies to allow use where different intermediate frequencies may exist in each system. Moreover, in a system having two such dual-loop PLL circuits, each can be configured with a different intermediate frequency, so that interference from one to the other is reduced.

34 Claims, 8 Drawing Sheets

DUAL PHASED-LOCKED LOOP STRUCTURE HAVING CONFIGURABLE INTERMEDIATE FREQUENCY AND REDUCED SUSCEPTIBILITY TO INTERFERENCE

BACKGROUND

The present invention relates to phase-locked loop systems, and particularly those incorporating more than one phase-locked loop circuit.

Phase locked loop (PLL) circuits are well-known in the art. Initially they were very expensive to implement, and found use in only the most technically-demanding and/or cost-insensitive applications. However, as the cost of integrated circuit technology has decreased over the years, and as the performance capability of such integrated circuit technology has increased, PLLs are currently extremely inexpensive to implement and are found in wide use in many applications.

FIG. 1 is a block diagram of a traditional phase locked loop circuit 100 configured to generate an output signal having a frequency which is a multiple M/N of an input signal frequency. The PLL circuit 100 includes a phase detector 101, a loop filter 102, and a voltage controlled oscillator (VCO) 104. An input signal is conveyed on node 112 to a first divider 105, which generates a divided-down signal on its output node 109. The output of the VCO 104 is conveyed on node 106 to a second divider 103 which generates a divided-down signal on its output node 107. The phase detector 101 receives both the signal derived from the input, conveyed on node 109, and the signal derived from the VCO, conveyed on node 107, and generates on its output node 108 an error signal typically representing the phase difference between the two input signals. The output 108 of the phase detector 101 is provided to the loop filter 102, and the output 110 of the loop filter 102 is provided as a control voltage to the VCO 104. As is well known, other PLL components or different PLL components may be utilized in the phase locked loop circuit 100. For example, a phase/frequency detector may be utilized instead of a phase detector. Various loop filter configurations and VCO configurations may also be employed, as well as other types of controlled oscillators, such as current-controlled oscillators. Other variations are well known in the art.

Such a PLL may be susceptible to interference from external signals. While many kinds of circuits are also susceptible to outside interference, PLLs may be particularly sensitive because of their frequent use as a generator circuit for reference signals, such as clock signals in a digital system, and the unusually stringent stability requirements such use may impose. In FIG. 2, the VCO 104 of the PLL circuit 100 is shown again. An interference source 120 generates a signal on node 122 having a frequency $f_o+\Delta f$ which can couple (124) into the VCO 104 whose operating frequency is $f_o$. Such coupling may be manifested as electromagnetic coupling, as power supply noise coupling from one circuit to the other, or as other forms of coupling. Such interference may be manifested as a clock jitter or clock phase noise on the VCO output node 106 which can degrade overall system performance.

Such PLL circuits used to generate a stable clock signal (e.g., a clock multiplying unit (CMU), a clock/data recovery circuit, etc.) may be designed to have a very low bandwidth in an attempt to provide a very stable clock output signal which provides high attenuation of any jitter of the input reference signal. But a PLL having a low bandwidth is more susceptible to interference than one having a higher bandwidth.

In many applications, the need to compromise the loop bandwidth may dictate a PLL whose jitter attenuation is less than desired and whose susceptibility to interference noise is greater than desired. Consequently, additional improvements are needed.

SUMMARY OF THE INVENTION

In an exemplary system containing a PLL circuit configured for clock/data recovery of an incoming data signal, the recovered clock signal may suffer interference from a substantially identical frequency signal in a nearby transmit sub-system for an outgoing data signal having the same data rate. Such interference may alternatively be caused by another PLL circuit within a second receive channel. Interference sources may be located in close proximity within the same system, within the same printed wiring board, or within the same integrated circuit. In some cases, the interference signal may operate at a much lower (i.e., very different) frequency, but its harmonics may be substantially the same frequency as the PLL operating frequency and may cause spurious phase noise of the PLL output signal.

Interference from an asynchronous source will cause spurious tones in the phase noise spectrum of the VCO. As the interference modulates the instantaneous frequency, an interferer at a close frequency (i.e., small $\Delta f$) will produce a larger phase noise component. Interference from a synchronous source can have several effects: first, if the interference is additive, it may transfer its phase noise to the VCO and thus reduce the jitter removal capabilities of the system. Second, if the interference is subtractive, it may reduce the intended bandwidth of the clock 'cleaning' system and thus add additional oscillator phase noise into the system. Third, if the interference is subtractive and strong relative to the gain within the PLL, it will destabilize the operating point and add phase error due to oscillations.

A wider bandwidth PLL (i.e., one with more gain in the loop) is more robust to interference effects for the following reasons: (1) asynchronous interferers at offset frequencies closer than the bandwidth are suppressed by the loop (these would be the worst phase noise offenders); and (2) stronger synchronous interferers will have a noticeable effect on the phase noise only if the gain from the interferer gets to be in the same order of magnitude as the gain in the PLL, thus an increase in bandwidth by 10× will decrease the sensitivity to interference by 10×.

To improve performance in the face of such interference, and in a broader context, to reduce the problem of synchronous interference into a low bandwidth loop, the PLL function may be implemented as a dual-loop structure having a first PLL circuit (i.e., a first loop) which generates an intermediate signal from the reference signal, and a second PLL circuit (i.e., a second loop) which generates the output signal from the intermediate signal. The intermediate signal frequency is preferably chosen at a value in which potential interference signals do not have much energy. The first loop preferably has low bandwidth to provide good input jitter attenuation, while second loop preferably has higher bandwidth to reduce phase noise of the output signal.

In certain embodiments, such a dual-loop circuit may be configurable to provide for a choice of several different intermediate frequencies. This allows such a circuit to be used in a variety of different systems where different intermediate frequencies may exist in each system. Moreover, in a system having two such dual-loop PLL circuits, each can be configured with a different intermediate frequency, so that interference from one to the other is reduced.

By providing one or more dual-loop PLL circuits having configurable intermediate frequencies, a system designer may plan the various frequencies which may exist in the system to reduce the effects of interference between circuits. For example, each such circuit may be configured to utilize an intermediate frequency which is well-spaced from other interference source frequencies and well-spaced from any harmonics of such other interference source frequencies, which may allow many such circuits to co-exist in close proximity in a system, on a board, or even within the same integrated circuit. In certain embodiments, such intermediate frequency choices preferably are all reasonably well spaced from any of the harmonic frequencies of the input frequency. A dual-loop PLL circuit configuration may be advantageously employed to reduce noise in the second loop output signal, even if the interference frequency is synchronous to the second loop VCO.

An exemplary digital OC-192 transceiver incorporates a dual-loop PLL circuit providing a choice of 5 different intermediate frequencies, allowing multiple such devices to co-exist in close proximity. The exemplary transceiver is preferably configurable for any of three operating frequencies (e.g., 9.95328 GHz, 10.3125 GHz, and 10.0000 GHz), and supports 66/64 rate conversion while simultaneously providing one of four forward error correction frequency scaling factors (e.g., 14/15, 15/14, 79/85, and 85/79), and also supports 64/66 rate conversion. Each of the intermediate frequencies is selectable to provide 2.5% channel spacings.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE INVENTION

Figure 1:
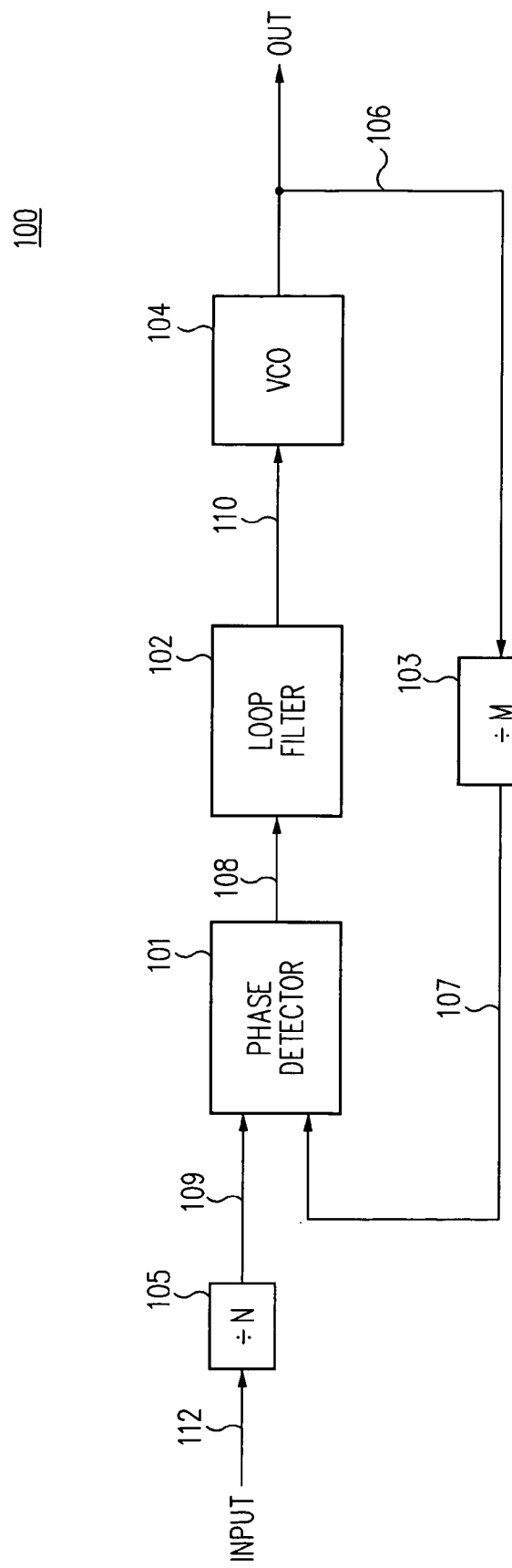
FIG. 1 is a block diagram of a traditional phase locked loop configured to multiply an input frequency.
Figure 2:
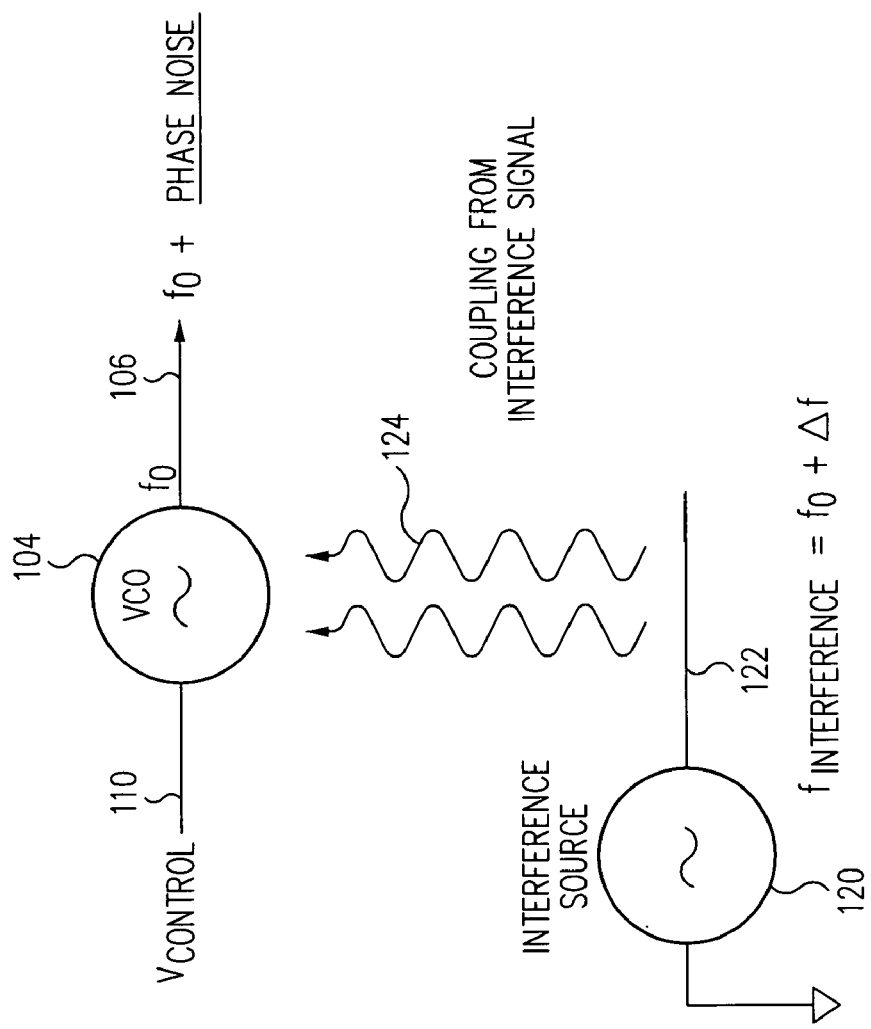
FIG. 2 is a diagram representing an interference signal coupling into a voltage controlled oscillator.
Figure 3:
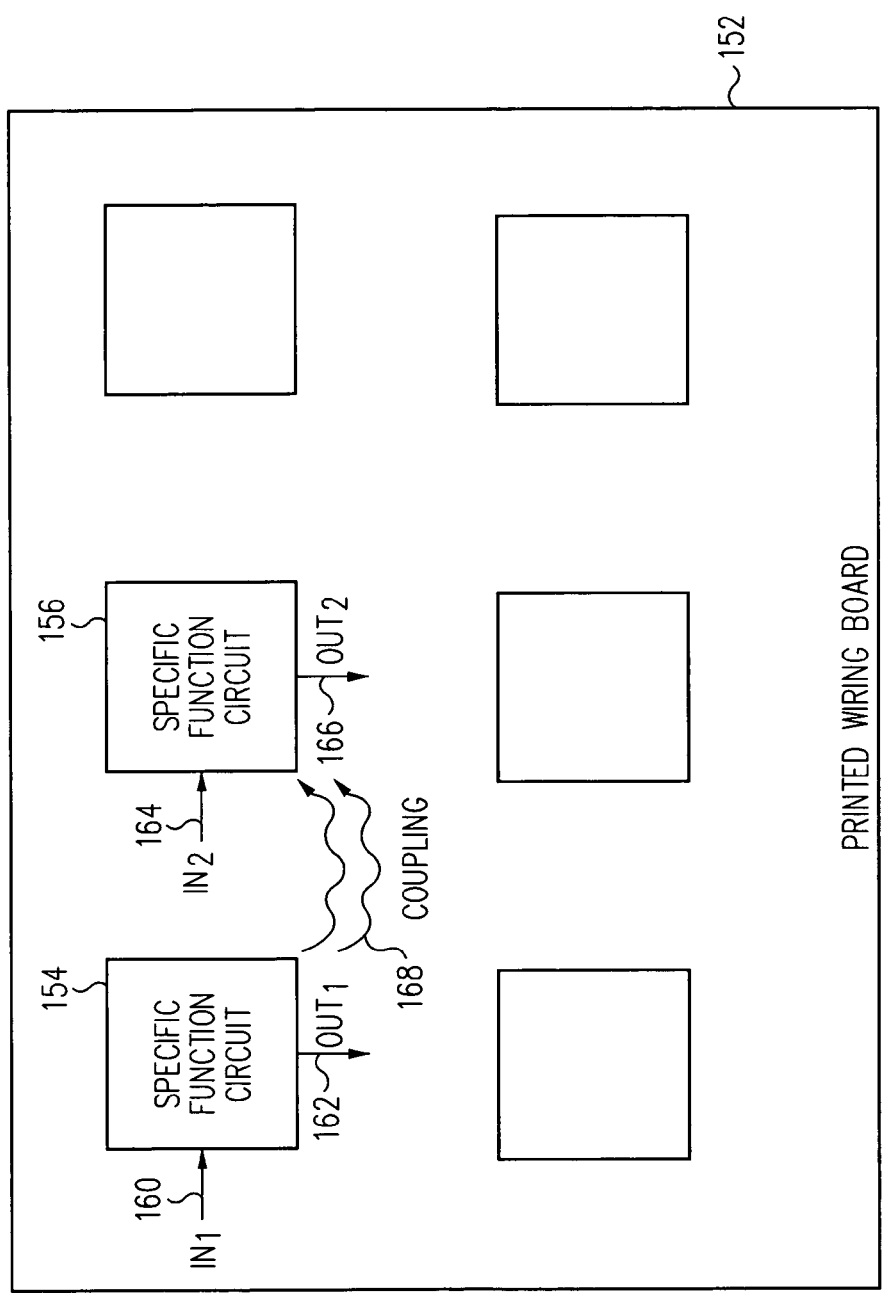
FIG. 3 is a block diagram depicting interference from one circuit on a printed wiring board onto another circuit on the board.

Referring now to FIG. 3, a printed wiring board 152 is shown containing several functional circuit blocks. Each of two such circuit blocks 154 and 156 are depicted as providing a specific function, here represented as a function responsive to a respective input signal IN1, IN2, and generating a corresponding output signal OUT1, OUT2. As shown, the Specific Function circuit block 154 receives an IN1 signal conveyed on node 160 and generates a corresponding output signal OUT1 conveyed on node 162 in accordance with the Specific Function. Similarly, the Specific Function circuit block 156 receives an IN2 signal conveyed on node 164 and generates a corresponding output signal OUT2 conveyed on node 166 in accordance with the Specific Function.

If these two circuit blocks 154, 156 are placed in close proximity to each other, one or more of the signals related to one of the circuit blocks may couple to the other circuit block, as indicated by coupling 168 from circuit block 154 to circuit block 156. Such coupling may be from the IN1 signal itself which, if operating at the same frequency as the IN2 signal, may manifest as a synchronous interference to the circuit block 156. In addition, such coupling may also result from internal circuit nodes and signals within the circuit block 154 which may couple into analogous circuit nodes and interfere with the analogous signals of the circuit block 156.

An example of an exemplary system 150 may include a printed wiring board 152 containing identical circuits to support multiple channels of data communication signals. If, as an example, circuit block 154 and circuit block 156 are implemented using the same functional circuitry, the internal signals from one may interfere with essentially the identical signal within the other. This may occur irrespective of whether one or both is implemented within separate integrated circuits, whether implemented discretely on the printed wiring board, or whether both are implemented within the same integrated circuit.

Figure 4:
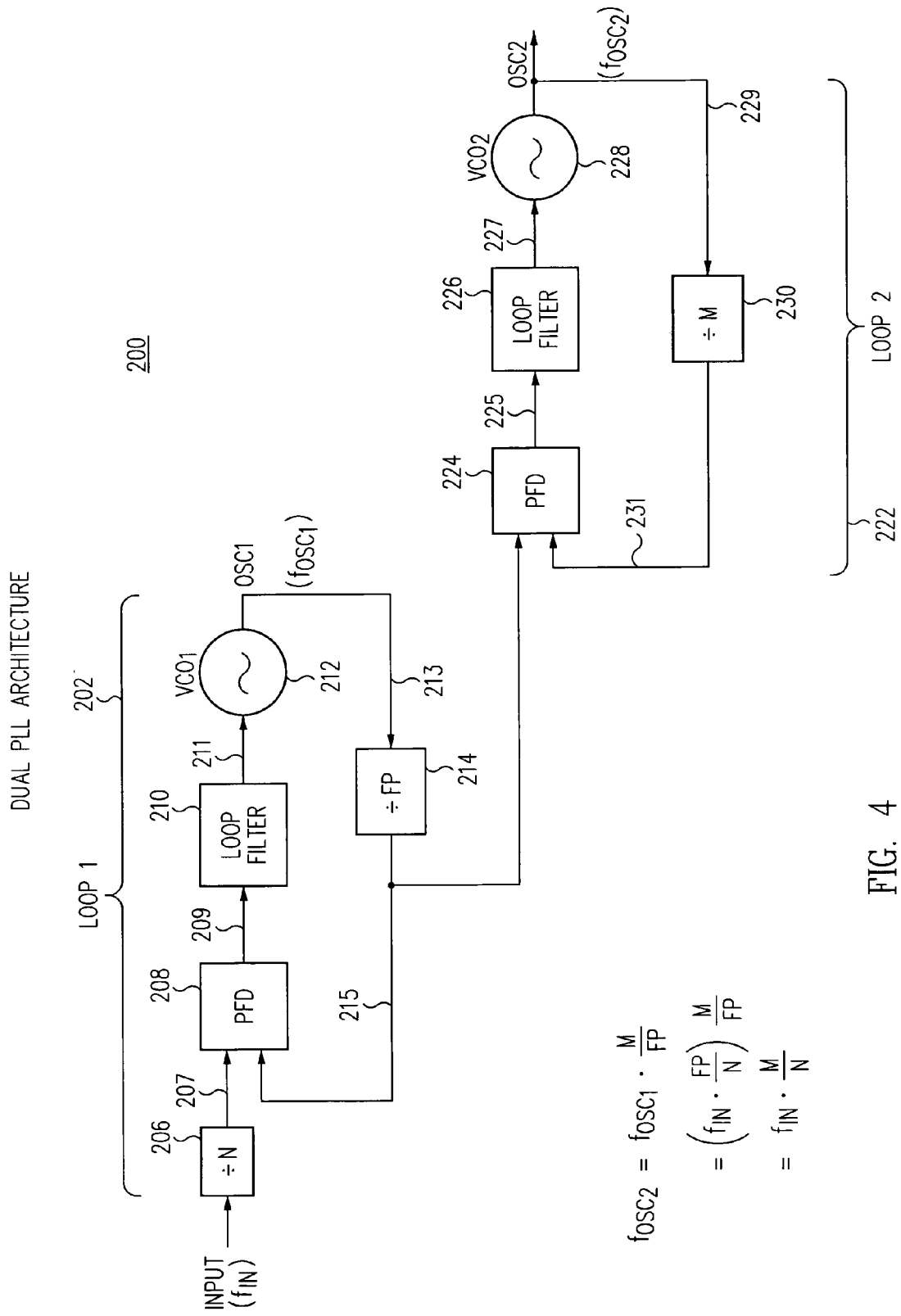
FIG. 4 is a block diagram of an embodiment of a dual PLL circuit in accordance with the present invention.

FIG. 4 is a block diagram of a dual PLL (i.e., dual loop) structure 200 in accordance with an embodiment of the present invention which is arranged to reduce the effects of such interference for specific function blocks which, for example, might otherwise contain a single phase locked loop. The dual loop 200 is configured to generate an output signal having a frequency which is a multiple M/N of an input signal frequency, as before. However, a first loop 202 responds to the input signal and generates an intermediate frequency signal 213 having a frequency $f_{OSC1}$ which is a multiple FP/N of the input signal frequency $f_{IN}$, and a second loop 222 generates an output signal having a frequency $f_{OSC2}$ which is a multiple M/FP of the intermediate signal frequency $f_{OSC1}$.

The first loop 202 includes a phase/frequency detector 208, a loop filter 210, and a voltage controlled oscillator 212. An input signal is conveyed to a first divider 206, which generates a divided-by-N signal on its output node 207, which is then conveyed to the phase/frequency detector 208. The output of the VCO 212 is conveyed on node 213 to a second divider 214 which generates a divided-by-FP signal on its output node 215. The phase detector 208 receives both the signal derived from the input (from divider 206, conveyed on node 207), and the signal derived from the VCO (from divider 214, conveyed on node 215), and generates an error signal 209 typically representing the phase difference between the two input signals, which is filtered by the loop filter 210, and the filtered output 211 provided as a control voltage to the VCO 212.

The second loop 222 includes a phase/frequency detector 224, a loop filter 226, and a voltage controlled oscillator 228. The output 215 of the divider 214 within the first loop is conveyed to one input of the phase/frequency detector 224. The output of the VCO 228 is conveyed on node 229 to a third divider 230 which generates a divided-by-M signal on its output node 231. The phase detector 224 receives both the signal 215 from the first loop, and the signal derived from the second-loop VCO (from divider 230, conveyed on node 231), and generates an error signal 225 which is filtered by the loop filter 226, and the filtered output 227 provided as a control voltage to the VCO 228.

As can be appreciated, the first loop 202 generates an intermediate signal $OSC_1$ on VCO 212 output node 213 having a frequency $f_{OSC1}$ which is a multiple FP/N times the input frequency $f_{IN}$. In addition, the second loop 222 generates an output signal $OSC_2$ on VCO 228 output node 229 having a frequency $f_{OSC2}$ which is a multiple M/FP times the frequency $f_{OSC1}$. Viewed together, the dual-loop configuration 200 generates an output signal $OSC_2$ having a frequency $f_{OSC2}$ which is a multiple M/N times the frequency $f_{IN}$ of the input signal to the dual-loop 200. But unlike a single loop, such a dual-loop structure may be advantageously configured to provide certain benefits usually achieved in a low bandwidth single loop by configuring the first loop 202 with a low bandwidth, and yet also provide certain benefits usually achieved in a higher bandwidth single loop by configuring the second loop 222 with a higher bandwidth.

Figure 5:
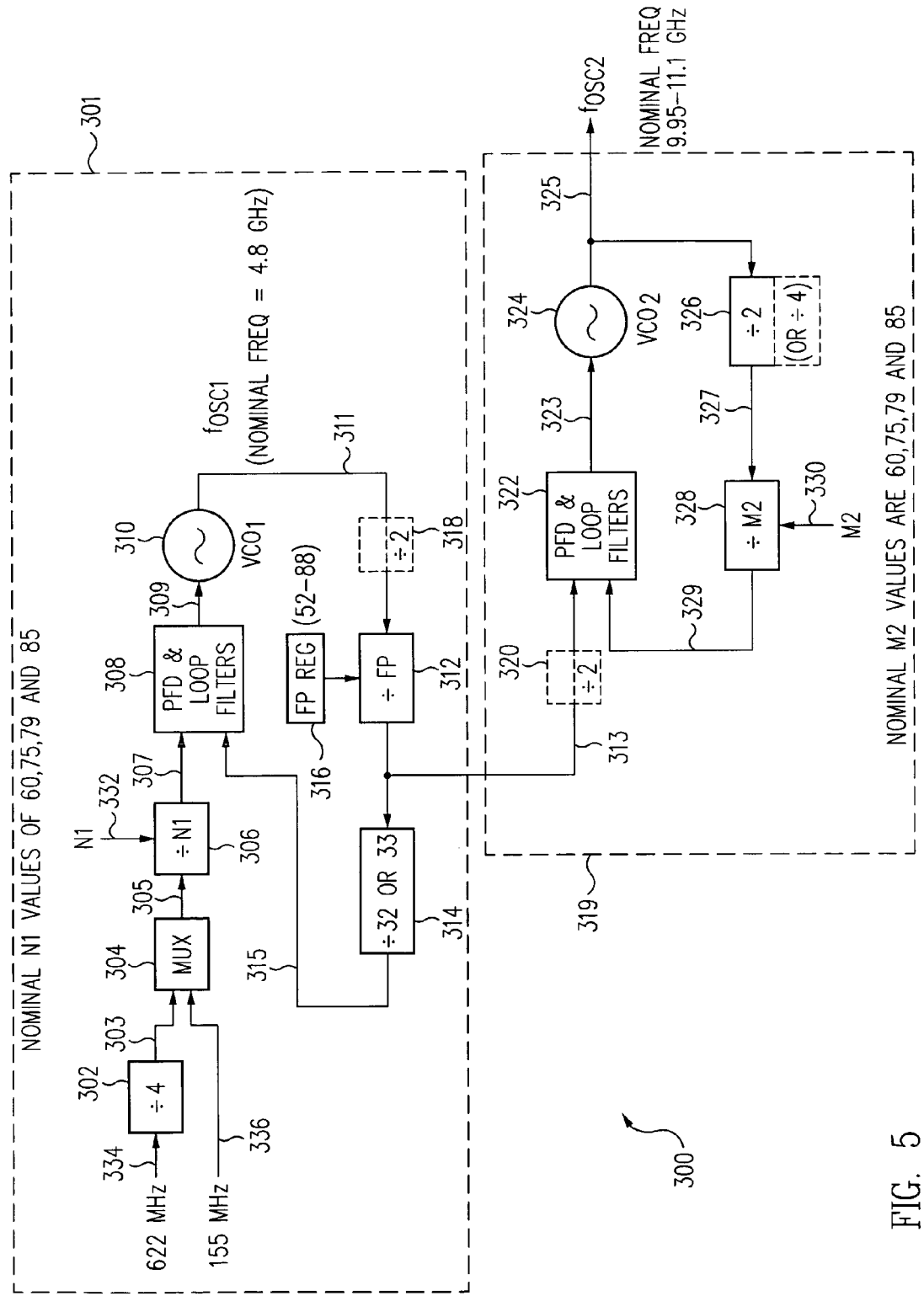
FIG. 5 is a block diagram of another embodiment of a dual PLL circuit in accordance with the present invention.

FIG. 5 is a block diagram of another dual loop structure 300 in accordance with an embodiment of the present invention. A first loop 301 responds to one of two input signals and generates an intermediate frequency signal 311 having a frequency $f_{OSC1}$ which is nominally approximately 4.8 GHz and which is either a multiple (32 or 33)*FP/N1 of the input signal frequency conveyed on node 336, or is a multiple (32 or 33)*FP/(4*N1) of the input signal frequency conveyed on node 334. A second loop 319 generates an output signal having a frequency $f_{OSC2}$ which is a multiple 2*M2/FP of the intermediate signal frequency $f_{OSC1}$.

The first loop 301 includes a phase/frequency detector and loop filter 308, and a voltage controlled oscillator 310. A first input signal 336 is conveyed to a multiplexer 304, and a second input signal is conveyed on node 334 to a divider 304 whose output 303 is also conveyed to the multiplexer 304. One of these two input paths is selected and the output 305 of the multiplexer 304 is conveyed to a first divider 306, which generates a divided-by-N1 signal on its output node 307, which is then conveyed to the phase/frequency detector 308. The output of the VCO 310 is conveyed on node 311 to a second divider 312 which generates a divided-by-FP signal on its output node 313. A third divider 314 then further divides the signal 313 by either 32 or 33 to generate an output signal 315. The phase detector 308 receives both the signal derived from the input (node 307), and the signal derived from the VCO (node 315), and generates an error signal (not shown) typically representing the phase difference between the two input signals, which is filtered and provided as a control voltage 309 to the VCO 310.

A FP register 316 is loaded with a value which then determines the divider value of the FP divider 312. An optional divide-by-2 block 318 may be included in some embodiments to lower the operating frequency of the variable divider 312.

The second loop 319 includes a phase/frequency detector and loop filter 322, and a voltage controlled oscillator 324. The output 313 of the FP divider 312 within the first loop 301 is conveyed to one input of the phase/frequency detector 322. The output of the VCO 324 is conveyed on node 325 to a divider 326 which generates a divided-by-2 signal (or optionally, a divided-by-4 signal) on its output node 327, which is then conveyed into another divider 328 which generates a divided-by-M2 signal on its output node 329. The phase detector 322 receives both the signal 313 from the first loop, and the signal 329 derived from the second-loop VCO, and generates an error signal which is filtered and provided as a control voltage 323 to the VCO 324.

As can be appreciated, the first loop 301 generates an intermediate signal $OSC_1$ on VCO 310 output node 311 having a frequency $f_{OSC1}$ which is a multiple (FP*33)/N1 times the frequency of the multiplexer 304 output signal 305, which is selected as either a first input reference signal conveyed on node 326 (shown here, for example, as a 155 MHz signal), or as a divided-by-4 version of a second input reference signal conveyed on node 324 (shown here, for example, as a 622 MHz signal). Exemplary values for the various dividers may be chosen to generate a nominal frequency $f_{OSC1}$ of approximately 4.8 GHz. In certain exemplary embodiments, preferable values of N1 for the divider 306 are 60, 75, 79, and 85; and preferable values for the FP divider 312 range from 52–88. In some embodiments, the optional divide-by-2 block 318 may be included and values provided to the FP register 316 (and hence conveyed to the FP divider 312) adjusted for a range of 26–44, resulting in the same overall divider ratio, but this reduces by one-half the maximum operating frequency of the variable FP divider 312, which makes its design less critical, although this doubles the channel spacing of the intermediate signal OSC1.

In addition, the second loop 319 generates an output signal $OSC_2$ on VCO 324 output node 325 having a frequency $f_{OSC2}$ which is a multiple 2*M2/FP times the frequency $f_{OSC1}$. In some embodiments, the optional divide-by-2 block 320 may be included and the divider 326 configured to divide by four rather than to divide by two (resulting in the same overall divider ratio). Doing so reduces by one-half the maximum operating frequency of the variable M2 divider 328, which makes its design less critical, although the update rate for the second loop 319 is reduced by half.

Viewed together with the first loop 301, the dual-loop configuration 300 generates an output signal $OSC_2$ having a frequency $f_{OSC2}$ which is a multiple 33*M2*2/N1 (or alternately, 32*M2*2/N1) times the reference frequency for the dual-loop (i.e., the selected one of two possible input signals, each having a frequency shown here, for example, as approximately 155 MHz). As may be appreciated, the frequency of the first loop, $f_{OSC1}$, can be adjusted over a relatively broad range without affecting the frequency of the second loop, $f_{OSC2}$. With the exemplary value for the various dividers as shown, the frequency $f_{OSC1}$ of the first loop may range from a low value of 3.154 GHz (e.g., N1=85, FP=52, and $f_{IN}$=156.25 MHz) to a high value of 7.562 GHz (e.g., N1=60, FP=88, and $f_{IN}$=156.25 MHz). Preferably, however, the nominal value $f_{OSC1}$ is chosen to be approximately 4.8 GHz with a narrower range of available frequencies, such as five different frequencies.

The advantages of this dual-loop arrangement are numerous. The dual-loop may be configured to achieve certain benefits usually achieved in a low bandwidth single loop by configuring the first loop 301 with a low bandwidth, and yet also achieve other benefits usually achieved in a higher bandwidth single loop by configuring the second loop 319 with a much higher bandwidth. For example, in a clock multiplying application, the low bandwidth of the first loop 301 will provide significant attenuation of reference signal jitter, while the high bandwidth of the second loop 319 provides lower jitter generation arising from the second loop VCO. Moreover, the intermediate frequency (i.e., the OSC1 output of the first loop) may be chosen to have a value which avoids likely interference frequencies, such as harmonic frequencies of various input and/or output signals that may be found nearby in the system. Additionally, if two or more such dual loop structures are placed in proximity with each other, the intermediate frequency of each may be chosen to be different from that of the other to reduce interference from one to the other. Such a "frequency planning" capability preferably provides a range of discrete frequencies which may be chosen for the intermediate frequency while keeping the final output frequency of the second loop unchanged. Such intermediate frequencies are preferably at least a predetermined offset from any harmonic of data signals entering and leaving a circuit containing such dual-loop (whether located in the same integrated circuit, or within the same semiconductor package, or on the same printed wiring board), for any of, for example, three data rates with or without forward error correction (FEC).

As an exemplary illustration, assume that the divider 314 is set to divide by 33, that the selected input signal 336 is a 156.25 MHz signal, and that optional divider 318 is not present within loop 301. Further assume that divider 326 is configured to divide by two, and that optional divider 320 is not present within loop 319. Further assume that the nominal $f_{OSC1}$ is 4.8 GHz, and the nominal $f_{OSC2}$ is 9.95–11.1 GHz. The minimum update rate of the first loop 301 is 1.8 MHz (corresponding to divider 306 being set to 85), and the minimum update rate of the second loop 319 is 29 MHz (corresponding to FP divider 312 being set to 88). The frequency plan granularity (i.e., "channel spacing") of the intermediate signal $f_{OSC1}$ is 1.25% of the nominal intermediate frequency, or 60 MHz. Preferably both loops 301 and 319 have a respective bandwidth that is selectable from a plurality of available settings. Preferred bandwidth settings (for certain embodiments) of the first loop 301 are 800 Hz, 18 KHz, 100 kHz, and 200 kHz, while preferred bandwidth settings for the second loop 319 are 1 MHz and 2 MHz.

The various dividers may be adapted to any of a wide variety of settings and ranges in accordance with the goals of a particular design. In the exemplary embodiment depicted in FIG. 5, the nominal values indicated for dividers 306, 314, and 326 are selected to support 66/64 rate conversion while providing one of four possible forward error correction (FEC) frequency scalings (e.g., 14/15, 15/14, 79/85, and 85/79) in a serial data environment, and to support 64/66 rate conversion. The circuit generates a nominal 10 GHz clock based on a reference clock (e.g., 155 MHz or higher) or a recovered clock from a serial data stream. The PFD/loop filter 308 is preferably adjusted according to N1 (i.e., the value of the N1 divider 332) to maintain constant bandwidth of the first loop 301.

A frequency planning example may be informative. The three prime data rates of 9.95328, 10.3125, and 10.00 Gbit/sec are spaced 3.6%, 3.1%, and 0.4% from each other. Spectrum gaps preferably exist with 2.5% frequency planning (such as would exist with the optional dividers 318, 320 present, and the divider 326 configured to divide by four). For example, assume the reference frequency ($f_{IN}$) is 156.25 MHz, and that $f_{OSC2}$ is equal to 66*$f_{IN}$=10.3125 G. In a first frequency plan, the value of FP may be equal to 80. The frequency $f_{OSC1}$=156.25/85*80*33=4.853G. The nearest harmonic is from 312.5/2*31=4.843G, for a difference in frequency of 10 MHz. In a second frequency plan, the value of FP may be equal to 78. The frequency $f_{OSC1}$=156.25/85*78*33=4.732G. The nearest harmonic is from 312.5/2*30=4.687G, for a difference in frequency of 56 MHz. As can be seen, the intermediate frequency $f_{OSC1}$ may be chosen so that the nearest harmonic is spaced at least a predetermined offset from the intermediate frequency.

Figure 6A:
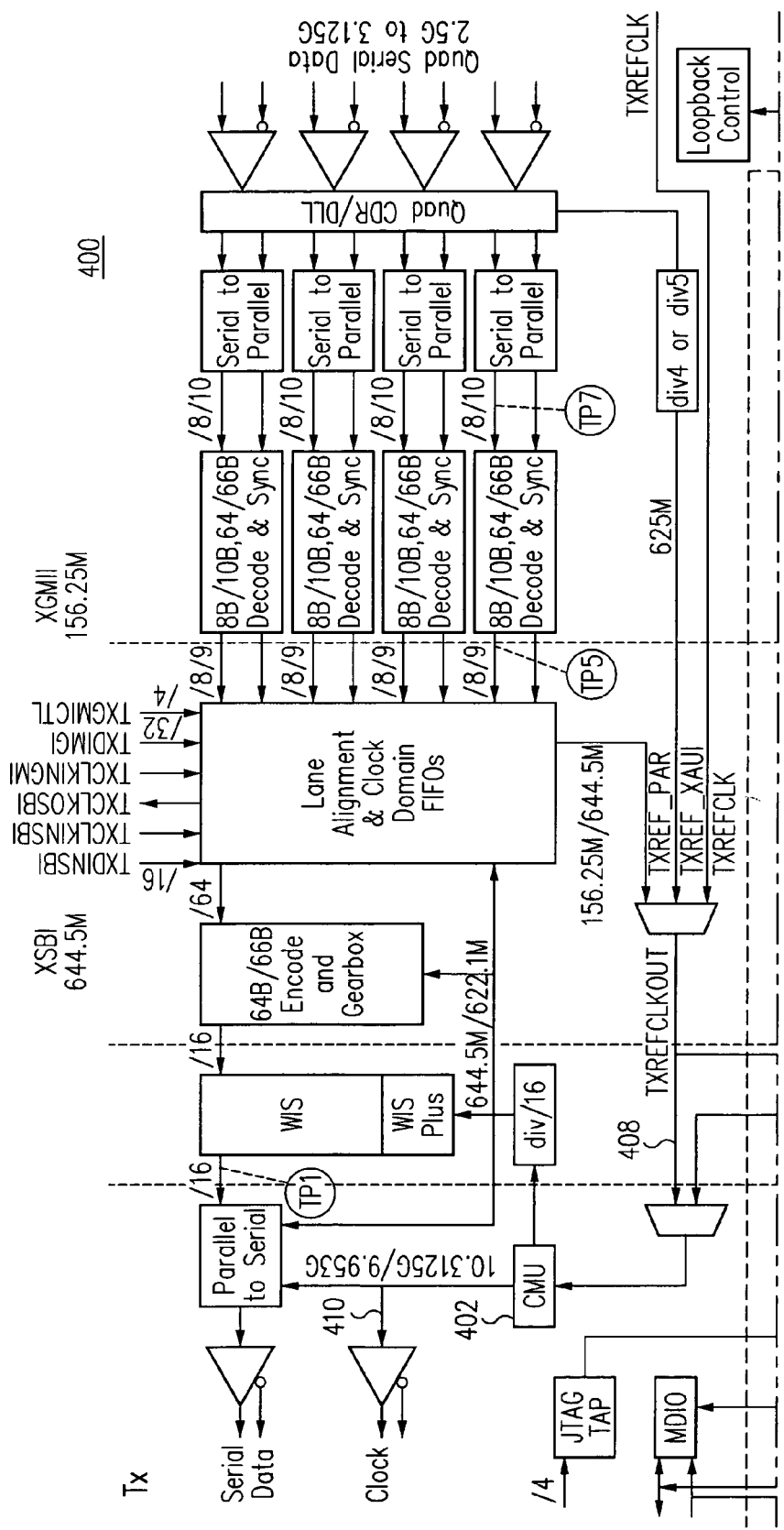
FIG. 6 (shown in two views respectively labeled FIG. 6A and FIG. 6B) is a block diagram of an exemplary OC-192 transceiver having a clock multiplying unit (CMU) incorporating a dual PLL architecture in accordance with some embodiments of the present invention.
Figure 6B:
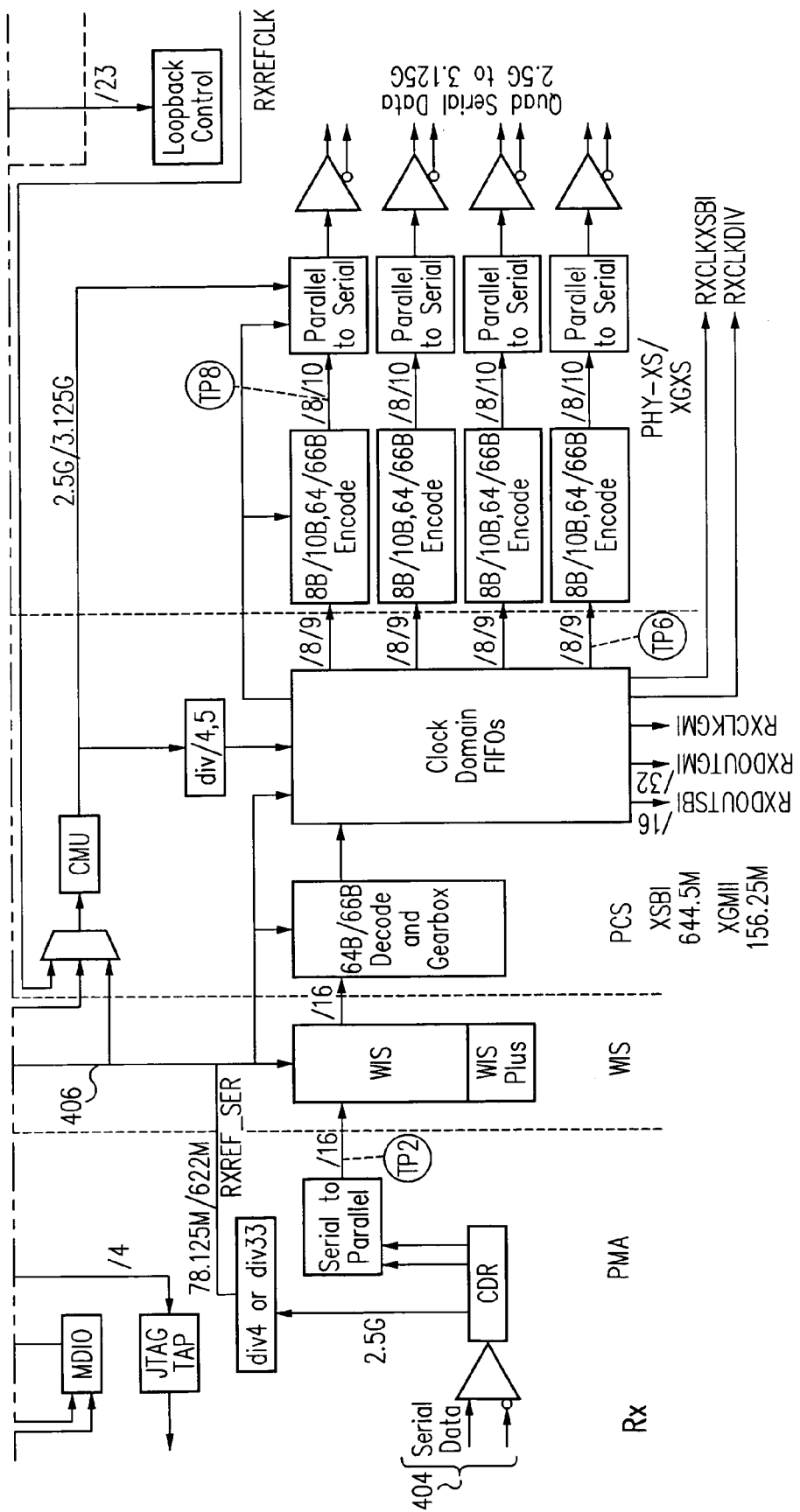

Referring now to FIG. 6, a transmitter/receiver integrated circuit 400 is depicted which advantageously incorporates a dual-loop structure within a clock-multiply unit (CMU) 402, which generates a serial clock signal on node 410 for the transmitter portion of the circuit. The reference signal for the CMU 402 may be selected as either a signal 406 derived from a first serial data stream 404, or a transmit reference clock output signal 408 (which itself may be selected from a transmitter reference clock input signal or a clock signal derived from a slower speed serial data stream).

Figure 7:
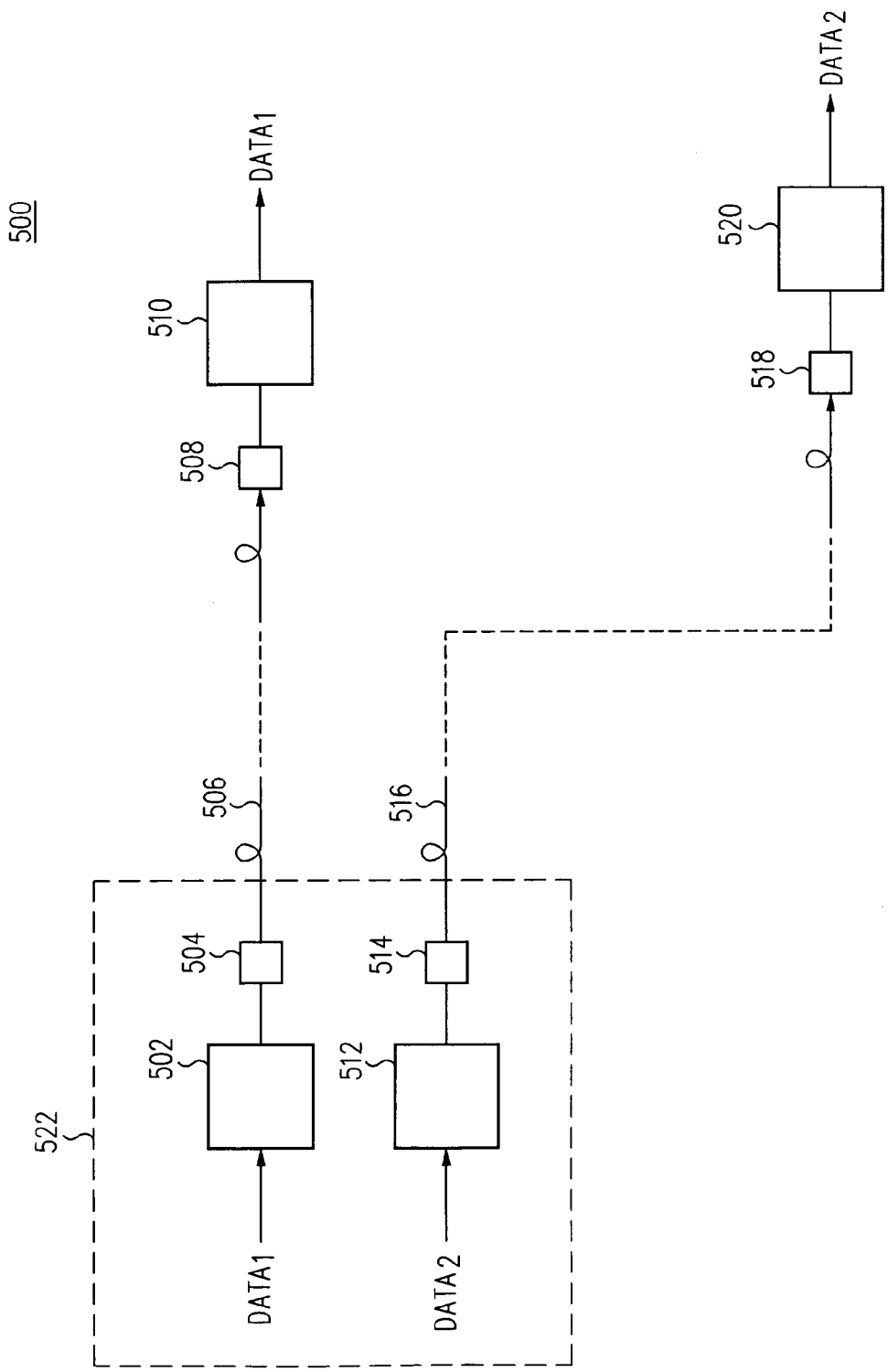
FIG. 7 is a block diagram of an exemplary fiber-optic system which utilizes more than one pair of transmitter/receiver circuits, each having a dual PLL architecture, in accordance with some embodiments of the present invention.

Referring now to FIG. 7, a fiber optic system is depicted which illustrates two transmitter circuits 502, 512 located within the same circuit block 522. A pair of optical drivers 504, 514 provides a respective optical signal into fibers 506, 516, which are received respectively by optical receivers 508, 518 and serial data receiver circuits 510, 520. The two transmitter circuits 502, 512 may be disposed on the same integrated circuit, or on separate integrated circuits located on the same printed wiring board (PWB), or may be located on different PWBs within the same system enclosure. In any such case, coupling may occur between the two transmitter circuits 502, 512. By using the frequency planning capability described above in the critical CMU function of the transmitter circuits, interference between transmitter 502 and transmitter 512 may be significantly reduced. Such an exemplary system may include, of course, additional channels to provide bi-directional capability.

Any of a variety of particular PLL structures may be advantageously utilized in dual loop structures contemplated herein. In certain embodiments the second loop 319 may incorporate a voltage controlled LC oscillator, although other types are also contemplated. Exemplary LC oscillators are described in U.S. Pat. No. 6,137,372 to Welland, which is hereby incorporated by reference, and further described in "Feedback System Incorporating Slow Digital Switching for Glitch-Free State Changes," by Rex T. Baird, et. al., U.S. application Ser. No. 10/180,833, filed on Jun. 25, 2002, which application is hereby incorporated by reference. Other types of controlled oscillators, such as a current controlled oscillator with a suitable control signal, are also contemplated. Other preferred circuits useful for implementing a phase locked loop circuit are described in U.S. Pat. No. 6,590,426 to Perrott, which is hereby incorporated by reference:

The invention is not contemplated to be limited to traditional silicon semiconductor technologies, as other suitable semiconductor technologies, such as gallium arsenide, silicon carbide, and indium phosphide may take advantage of the teachings herein. Preferably a dual loop structure is embodied in one or more integrated circuits, although discrete implementations are also contemplated.

Even though certain embodiments of the invention are described in the context of a dual phase locked loop circuit arranged for clock multiplication, it should be appreciated that such a circuit is not necessarily required unless specifically enumerated in a particular claim, and other circuits for generating an output signal as a function of an input signal may also incorporate a frequency planning capability as described herein.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., VCOs, loop filters, divider blocks, multiplexer blocks, input/output buffers, etc.) are not specifically described, such circuits are well known, and no particular advantage is believed to be afforded by specific variations of such circuits in the context of practicing this invention. In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure. Moreover, the various features and embodiments of the invention described above are specifically contemplated to be used alone as well as in various combinations.

Conventional circuit design and layout tools may be used to implement the invention. The specific embodiments described herein, and in particular the operating frequencies depicted, are illustrative of exemplary embodiments, and should not be viewed as limiting the invention to such specific implementation choices. Accordingly, plural instances may be provided for components described herein as a single instance. Boundaries between various components, operations and circuits are somewhat arbitrary, and particular operations are illustrated in the context of specific illustrative configurations. Other allocations of functionality are envisioned and may fall within the scope of claims that follow. For example, in some realizations, certain aspects may be performed using circuit, under control of software, or using a combination of circuit and software functionality. In addition, the block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While circuits and physical structures are generally presumed, it is well recognized that in modem semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Moreover, such claims are intended to read upon embodiments using more general purpose hardware under firmware or software control. Finally, structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. Accordingly, other variations, modifications, additions, and improvements may fall within the scope of the invention as defined in the claims that follow.

What is claimed is:

1. A circuit comprising:
   a first signal generation circuit for generating a first output signal having a frequency which is proportional to that of a first input signal, said first signal generation circuit comprising
      a first phase locked loop (PLL) circuit for generating a first intermediate signal having a frequency which is proportional to the first input signal frequency; and
      a second phase locked loop circuit for generating the first output signal having a frequency which is proportional to the first intermediate signal frequency;
      wherein, for a given first input signal frequency and a given first output signal frequency, the first intermediate signal frequency is selectable from a first plurality of available frequencies;
   a second signal generation circuit for generating a second output signal having a frequency which is proportional to that of a second input signal, said second signal generation circuit comprising
      a third phase locked loop circuit for generating a second intermediate signal having a frequency which is proportional to the second input signal frequency; and
      a fourth phase locked loop circuit for generating the second output signal having a frequency which is proportional to the second intermediate signal frequency;
   wherein the first input signal frequency is substantially identical to the second input signal frequency; and
   wherein the first and second signal generation circuits are configured so that the first output signal frequency is substantially identical to the second output signal frequency, but also configured so that the first intermediate signal frequency is different than the second intermediate signal frequency.

2. The circuit of claim 1 wherein the first PLL has a lower bandwidth than the second PLL.

3. The circuit of claim 2 wherein the bandwidth of the first PLL is selectable from a first plurality of values.

4. The circuit of claim 2 wherein the third PLL has a lower bandwidth than the fourth PLL.

5. The circuit of claim 1 wherein the first input signal is derived from a reference signal for a serial data signal.

6. The circuit of claim 1 wherein the first output signal frequency is equal to M times the first input signal frequency, where M is a positive integer.

7. The circuit of claim 1 wherein the first output signal frequency is equal to M/N times the first input signal frequency, where M and N are both positive integers.

8. The circuit of claim 1 wherein the first output signal frequency is other than an integer ratio times the first input signal frequency.

9. The circuit of claim 1 wherein each of the first plurality of available frequencies falls by at least a predetermined offset from any harmonic frequency of the given first input signal frequency and the given first output signal frequency.

10. The circuit of claim 9 wherein the first plurality of available frequencies numbers at least five.

11. The circuit of claim 9 wherein the first plurality of available frequencies are spaced approximately 2.5% apart, relative to a nominal first intermediate signal frequency.

12. The circuit of claim 9 wherein the first plurality of available frequencies are spaced approximately 1.25% apart, relative to a nominal first intermediate signal frequency.

13. The circuit of claim 1 encoded in a computer readable medium suitable for design, test, or manufacture of an integrated circuit.

14. The circuit of claim 1 wherein, for a given second input signal frequency and a given second output signal frequency, the second intermediate signal frequency is selectable from a second plurality of available frequencies.

15. The circuit of claim 14 wherein the first and second signal generation circuits are substantially identical.

16. The circuit of claim 14 wherein the respective bandwidth of the first PLL and the third PLL is selectable from a respective plurality of values.

17. The circuit of claim 14 wherein each of the first and second pluralities of available frequencies falls by at least a predetermined offset from any harmonic frequency of the given first input signal frequency and the given first output signal frequency.

18. The circuit of claim 17 wherein the first and second plurality of available frequencies each numbers at least five.

19. The circuit of claim 1 wherein the first and second signal generation circuits are disposed within a single integrated circuit.

20. The circuit of claim 1 wherein the first and second signal generation circuits are disposed within different integrated circuits on a single printed wiring board.

21. The circuit of claim 1 wherein the first and second signal generation circuits are disposed on different printed wiring boards within one system enclosure.

22. The circuit of claim 1 wherein the first and second input signals are associated with independent serial data channels.

23. The circuit of claim 22 wherein the first and second input signals are derived from a respective reference signal for a respective serial data signal.

24. The circuit of claim 1 wherein the first and second signal generation circuits each comprises a clock multiplying circuit.

25. The circuit of claim 24 wherein the first and second signal generation circuits each comprises a portion of a serial digital communications circuit.

26. A method comprising:
generating a first intermediate signal having a frequency which is a first factor times a first input signal frequency;
generating a first output signal having a frequency which is a second factor times the first intermediate signal frequency;
choosing the first intermediate signal frequency from a plurality of available frequencies by appropriately choosing the first factor;
choosing the second factor to result in a desired proportionality between the first input signal and the first output signal;
generating a second intermediate signal having a frequency which is a third factor times a second input signal frequency;
generating a second output signal having a frequency which is a fourth factor times the second intermediate signal frequency;
choosing the second intermediate signal frequency from a second plurality of available frequencies by appropriately choosing the third factor; and
choosing the fourth factor to result in a desired proportionality between the second input signal and the second output signal;
wherein the first input signal frequency is substantially identical to the second input signal frequency;
wherein the first output signal frequency is substantially identical to the second output signal frequency; and
wherein the first intermediate signal frequency is different than the second intermediate signal frequency.

27. The method of claim 26 further comprising using a first phase-locked loop circuit to generate the first intermediate signal.

28. The method of claim 26 further comprising using a second phase-locked loop circuit to generate the first output signal.

29. The method of claim 28 further comprising configuring the first phase-locked loop circuit with a lower bandwidth than the second phase-locked loop circuit.

30. The method of claim 26 further comprising choosing the first intermediate signal frequency to avoid harmonics of the first input signal and the first output signal.

31. The method of claim 26 further comprising generating the first and second output signals within a single integrated circuit.

32. The method of claim 26 further comprising generating the first and second output signals on a single printed wiring board.

33. The method of claim 26 further comprising generating the first and second output signals on different printed wiring boards within one system enclosure.

34. The method of claim 26 wherein the first and second input signals are associated with independent serial channels.

* * * * *